United States Patent [19]

Sim et al.

[11] Patent Number: 4,997,778
[45] Date of Patent: Mar. 5, 1991

[54] PROCESS FOR FORMING A SELF-ALIGNED FET HAVING A T-SHAPED GATE STRUCTURE

[75] Inventors: Kyunhwan Sim, Chungbuk; Yungkyu Choi, Chungnam; Chunuk Yang, Chungnam; Chinhee Lee, Chungnam; Chinyung Kang, Chungnam, all of Rep. of Korea

[73] Assignee: Korea Electronics and Telecommunications Research Institute, Rep. of Korea

[21] Appl. No.: 402,607

[22] Filed: Sep. 5, 1989

[30] Foreign Application Priority Data

Sep. 5, 1988 [KR] Rep. of Korea ............... 88-11473

[51] Int. Cl.$^5$ ........................................... H01L 21/28
[52] U.S. Cl. ...................................... 437/40; 437/41; 437/44; 437/187; 437/203; 437/912; 148/DIG. 100
[58] Field of Search ............ 437/40, 41, 44, 187, 437/203, 912; 148/DIG. 100

[56] References Cited

U.S. PATENT DOCUMENTS

| 4,536,942 | 8/1985 | Chao et al. | 29/571 |
| 4,551,905 | 11/1985 | Chao et al. | 29/571 |
| 4,561,169 | 12/1985 | Miyazaki et al. | 437/203 |
| 4,599,790 | 7/1986 | Kim et al. | 29/571 |
| 4,728,621 | 3/1988 | Graf et al. | 437/41 |
| 4,808,545 | 2/1989 | Balasubramanyam | 437/184 |

Primary Examiner—Brian E. Hearn
Assistant Examiner—Tuan Nguyen
Attorney, Agent, or Firm—Evenson, Wands, Edwards, Lenahan & McKeown

[57] ABSTRACT

A process for formation of a GaAs MESFET for use in digital IC and MMIC is disclosed, the MESFET having a high operating speed and low noise characteristics. A multilayer resist comprising a nitride film, a photo resist, a titanium deposition layer, and a SiO layer made by SOG (spin-on-glass) is formed, and a gate which is formed in the length of 0.7-1 μm by applying the photo transfer method is transcribed in the length of 0.3-0.5 μm. The pattern of the gate is transcribed by etching it down to GaAs, and the place for the positioning of the T-shaped gate is defined by depositing tungsten silicide and by side-etching the photo resist. The T-shaped gate is manufactured by electroplating gold, and by lifting off the rest of the portions. The source and drain are then formed in a self-aligned manner by ion-implanting to a high concentration, and then a heat treatment is carried out to make active. A resistant contact is then formed by applying the photo transfer method and an etching, and is completed by depositing AuGe/Ni and by carrying out an alloy-treatment. A conventional metallization is then performed to complete the self-aligned gaAs MESFET having a T-shaped gate.

8 Claims, 5 Drawing Sheets

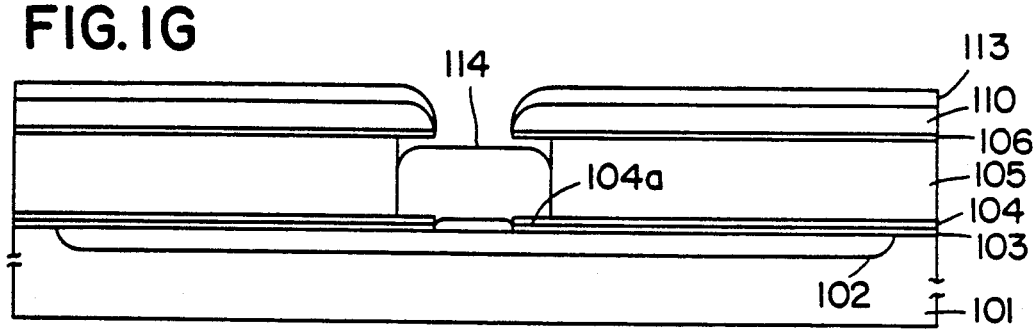
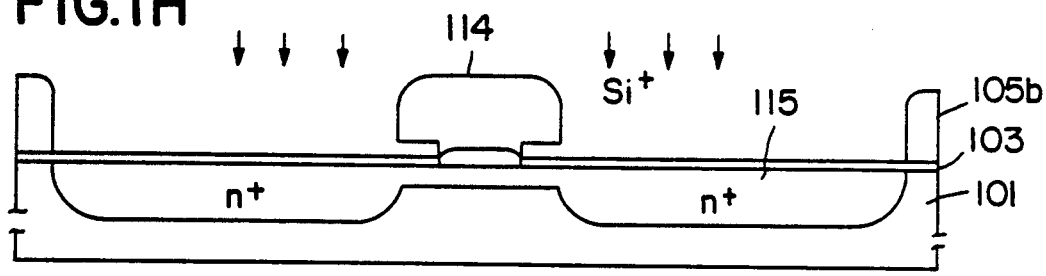
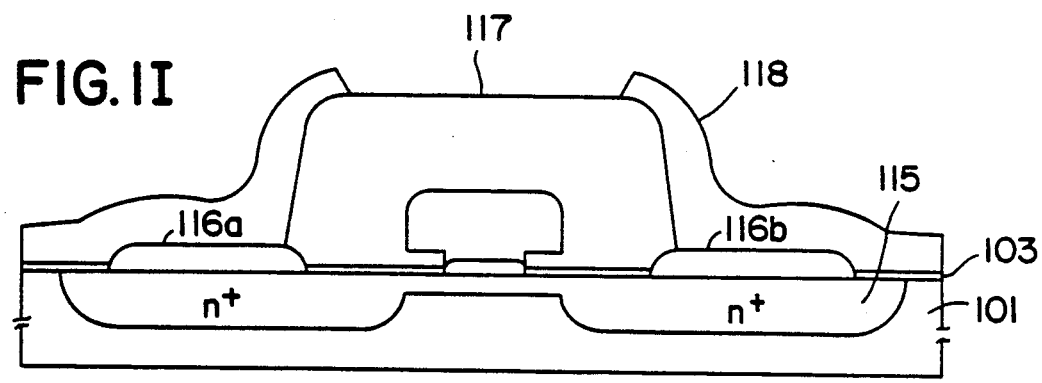

PROCESS FOR FORMING A SELF-ALIGNED FET HAVING A T-SHAPED GATE STRUCTURE

BACKGROUND OF THE INVENTION

The present invention relates to a method for producing a self-aligned field effect transistor (FET) and, in particular, to a method for producing a self-aligned metal-semiconductor field effect transistor (MESFET) using III-IV compound semiconductors such as gallium arsenide (GaAs).

Gallium arsenide MESFET devices are useful in digital integrated circuits and high-frequency applications, e.g., in the microwave range. In such applications, it is necessary to improve the low noise property while reducing the gate resistance and the source-gate capacitance. In addition, it is desired to reduce the source resistance and increase the drain breakdown voltage. Attempts have been made to reduce the gate resistance and gate capacitance by reducing the gate length. For example, FIG. 2 shows a self-aligned N+-layer technology type field effect transistor produced using a dummy gate and multi-layer resist technology. In this structure, a semi-insulating gallium arsenide substrate 101b has an ion implanted active layer 102b therein. Through contact holes in an insulating layer 111b are formed source and drain contacts 116b and a Schottky gate contact 114b. However, using this technology, the oxide lift-off is difficult, and it is also difficult to reduce the gate length of the gate 114b less than 0.6 microns using conventional photolithographic and etching techniques. The capacitance between the gate and source is also undesirably large.

FIG. 3 shows another attempt to reduce the gate length by forming a self-aligned field effect transistor having side walls 119e. As shown in FIG. 3 a semi-insulating gallium arsenide substrate 101c has formed therein an active layer with silicon ion implanted ohmic contact regions 115c. An insulating region 111c is provided with source and drain contacts 116b being insulated from the gate 114c by side walls 119e. As with the structure shown in FIG. 2, it is difficult to reduce the gate length of the gate 114c to less than 0.6 microns. It is also difficult to control the process to prevent reaction from occurring between the ohmic contact region 116b and the rectifying junction of the gate 114c.

The structure shown in FIG. 4 has been developed in an attempt to reduce the length of the gate 114d to less than 0.5 microns using photolithography and etching. The structure shown in FIG. 4 has a semi-insulating gallium arsenide substrate 101d having an active layer 102d and ohmic contact regions 115d. Source and drain contact 116c contact the ohmic contact regions 115d through holes in the insulating layer 111d. Intrinsic side wall spacers 120 separate the gate 114d from the source and drain ohmic contact regions 115d. However, the capacitance of the gate-source through the insulating film is large and parasitic currents exist.

FIG. 5 shows a slant evaporation technique used in an attempt to reduce the gate length of the gate 114e to less than 0.5 microns. However, since it is difficult to control the slant evaporation, the reproducibility of the process in mass production is difficult.

Accordingly, it is still desired to provide a method for producing a self-aligned FET in particular a gallium arsenide MESFET, having a gate length less than 0,6 microns, for example, in the range of 0.3 to 0.5 microns, which is suitable for mass production and which achieves high reproducibility.

SUMMARY OF THE INVENTION

The present invention overcomes the above-described disadvantages and produces a self-aligned field effect transistor having an active layer in a substrate, a T-shaped gate electrode having a predetermined gate length over a portion of the active layer, and a source contact region and a drain contact region in the substrate on either side of the T-shaped gate. The T-shaped gate preferably has a gate length less than 0.6 microns, for example in a range of 0.3 to 0.5 microns. The method comprises providing a substrate having an active layer therein and forming a first resist layer over the substrate. A second resist layer is formed over the first resist layer and a patterned first masking layer is formed over the second resist layer. The second resist layer is etched using the patterned masking layer as a mask to leave a portion of the second resist layer in the form of a dummy gate having a predetermined gate length over the active layer. A second masking layer is deposited over portions of the first resist layer which are not covered by the second resist layer and over the second resist layer, and the second resist layer is etched to remove the dummy gate and the second masking layer overlying the dummy gate. The first resist layer is etched using the second masking layer as a mask and exposing a portion of the active layer which corresponds to the predetermined gate length. A conductive material is deposited over the portion of the active layer which corresponds to the predetermined gate length, and side portions of the first resist layer are etched using the second masking layer as a mask to leave portions of the second masking layer overhanging an opening in the first resist layer. Conductive material is deposited in the opening in the first resist layer to form the T-shaped gate, and the first resist layer is etched away. Using the T-shaped gate as a mask, the substrate is doped and the source contact region and the drain contact region are formed.

The patterned first masking layer can have a pattern such that a portion of the first masking layer having a length of approximately 0.7 to 0.8 microns is left overlying the second resist layer. The side walls of the second resist layer can then be ion etched, so that the pattern can be reduced to 0.3 to 0.5 microns in the second resist layer, thereby forming a dummy gate. The pattern of the dummy gate can be transferred to the first resist layer and subsequently a portion of the active layer corresponding to a gate length of 0.3 to 0.5 microns can be exposed. Preferably, a first conductive material such as tungsten silicide is deposited on the exposed surface of the active layer by, e.g., sputtering. The tungsten silicide layer protects the surface of the gallium arsenide during etching of the side wall in the first resist layer and during any high temperature process such as activation of ion implantation impurities. Preferably, titanium is then deposited on the tungsten silicide and the exposed titanium is plated with gold to form the T-type gate.

BRIEF DESCRIPTION OF THE DRAWINGS

FIGS. 1A-1I are cross-sectional views of the method for producing a self-aligned field effect transistor according to the present invention.

DETAILED DESCRIPTION OF THE INVENTION

Figure 1A:
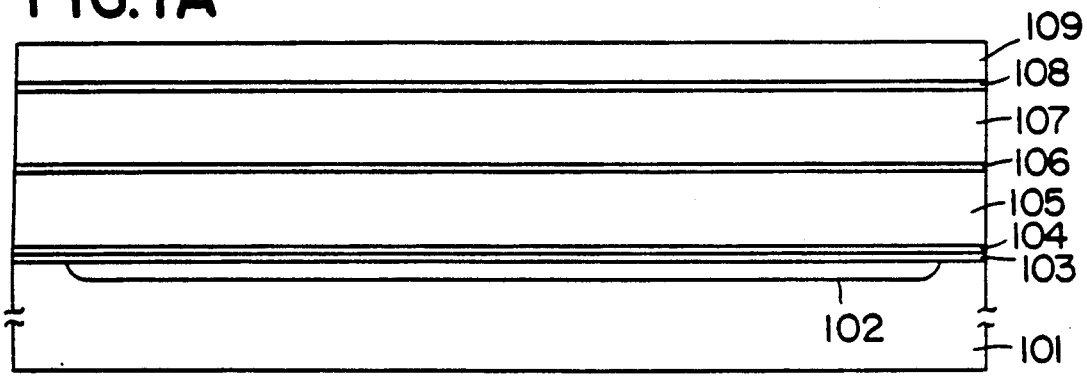

FIGS. 1A to 1I are cross-sectional views of various stages of the method of the present invention. As shown in FIG. 1A, a semi-insulating gallium arsenide substrate 101 is provided with an active layer 102 appropriately doped to form an enhancement-type/depletion-type (E/D) field effect transistor. The active layer 102 is formed by providing a photoresist mask (not shown) on the semi-insulating gallium arsenide substrate 101 and implanting silicon ions at a dose of $1 \times 10^{12}$ to $1 \times 10^{13}/cm^2$ and an energy of about 150 Kev. After removal of the photoresist mask, an insulating layer such as a nitride layer 103 is deposited to a thickness of, e.g., 500 to 800 Å by, e.g., plasma enhanced chemical vapor deposition. A metal layer, such as a titanium layer 104, may then be deposited on the nitride layer 103. The titanium layer 104 may be used in a later step of the process as an electrode for gold plating the T-shaped gate. The titanium layer 104 may be deposited by sputtering titanium to form a layer about 1,000 Å thick. A photoresist layer 105 is deposited on the titanium layer 104. The photoresist layer is provided with a thickness approximately equal to the desired thickness of the T-shaped gate, e.g., 0.5 to 0.8 microns. The photoresist layer can be baked at about 110° C. for about sixty minutes Subsequently, an insulating layer such as a nitride layer 106 is, e.g., sputtered to a thickness of about 0.1 micron. A second or intermediate photoresist layer 107 is then deposited on the nitride layer 106. The second or intermediate photoresist layer 107 will eventually form the dummy gate and is preferably deposited with a thickness of 0.1 to 2.0 microns. This layer can also be baked at about 110° C. for twenty minutes. A masking layer, preferably a doped oxide layer such as spin-on-glass 108 is then deposited to a thickness of about 0.1 micron and is baked at about 200° C. for twenty minutes. The doped oxide layer 108 is useful to etch the second or intermediate photoresist layer 107. Subsequently, an upper layer photoresist 109 is deposited to form the structure shown in FIG. 1A.

Figure 1B:
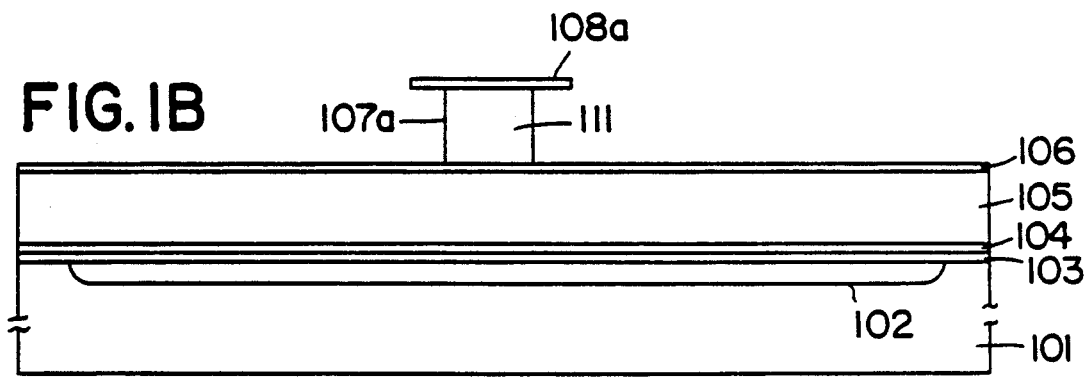

By conventional photolithographic techniques, the photoresist layer 109 is patterned to have a gate shape corresponding to a gate length of approximately 0.6 to 1.0 micron. The patterned photoresist layer 109 is used as a mask to etch the doped oxide layer 108 to have approximately the same gate shape. For example, the doped oxide layer can be etched at an applied voltage of 100 V and a power of 500 W under a pressure of 400 to 500 mTorr at an etching rate of 0.1 to 0.2 μm/minutes using a mixed gas of $C_2F_6$ and $CHF_3$ at 20 to 30 sccm (standard cubic centimeters per minute) and 30 to 50 sccm. Etching of the doped oxide layer 108 leaves a patterned doped oxide layer 108a as shown in FIG. 1B. The second or intermediate photoresist layer 107 is then etched including side wall etching of the photoresist layer 107. The side wall etching of the intermediate photoresist layer 107 is performed under a pressure of 400 to 700 mTorr and a power of 800 to 1,500 W using a mixed gas of oxygen and $SF_6$ at 70 sccm and 30 sccm. The layer is anisotropically etched at an etching rate of approximately 0.5 to 2.0 μm/minute. Accordingly, the shape of the patterned doped oxide layer 108 is reduced and transferred to the photoresist layer 107. The patterned photoresist layer 107a forms a dummy gate 111 having a shape corresponding to a gate length of 0.3 to 0.5 microns. As can be seen in FIG. 1B, the side etching of the photoresist layer 107 leaves the patterned doped oxide layer 108 overhanging the dummy gate 111.

Figure 1C:
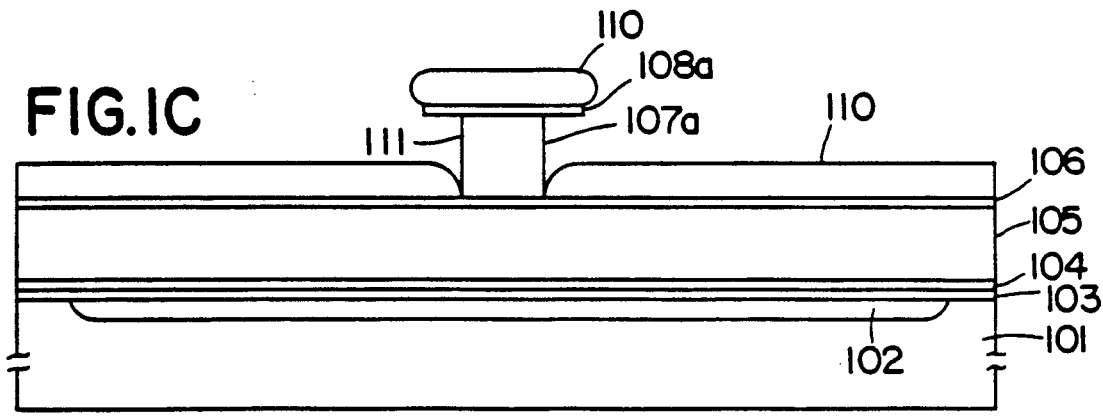

A masking layer such as an oxide layer 110 is then deposited, e.g., by vapor deposition, to a thickness of about 2,000 to 3,000 Å, as shown in FIG. 1C. The oxide layer 110 forms over the exposed nitride layer 106 which is over portions of the first photoresist layer 105 not covered by the dummy gate 111. The oxide layer 110 also forms over the patterned doped oxide layer 108a where it is separated from the portion formed over the nitride layer 106 due to the overhang of the patterned doped oxide layer 108a over the dummy gate 111.

Figure 1D:
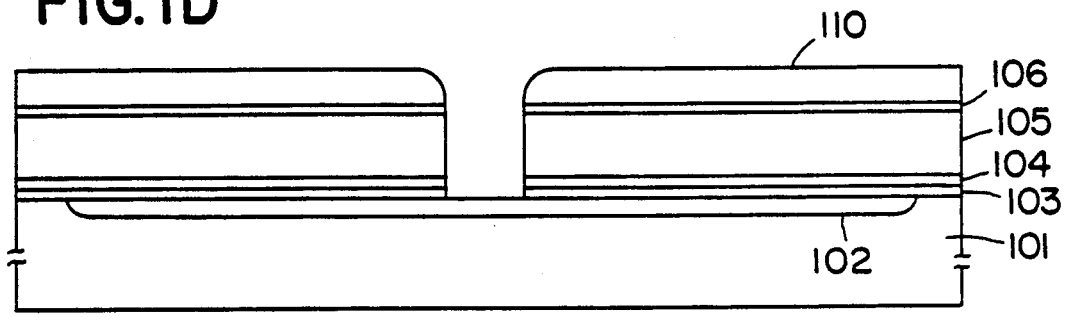

The dummy gate 111 is then lifted off to expose the nitride layer 106. The exposed nitride layer 106 is then etched under a pressure of 500 to 100 mTorr and a voltage of 300 W at an etching rate of 0.2 μm/minute using a mixed gas having a 10:1 ratio of $CF_4$ and oxygen gas. Etching of the lower layer photoresist 105 is then performed under a pressure of 100 to 400 mTorr and an applied voltage of 300 to 500 V at an etching rate of 0.3 to 0.8 μm/minute using a mixed gas having 20% of $C_2ClF_5$ in oxygen. The titanium layer 104 is etched under a pressure of 28 mTorr at an etching rate of 200 Å/minute using $CCl_2F_2$, and the nitride layer 103 exposed with the etching of the titanium layer 104 is etched under the same conditions as the etching of the nitride layer 106. The resulting structure is shown in FIG. 1D.

Figure 1E:
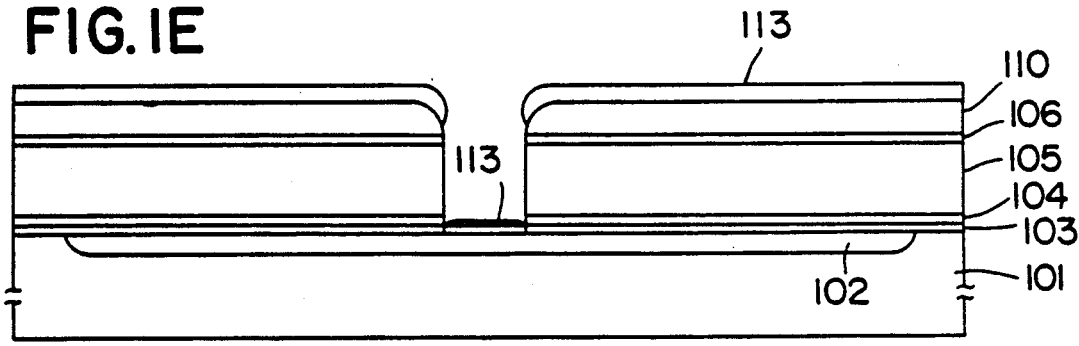
Figure 1F:
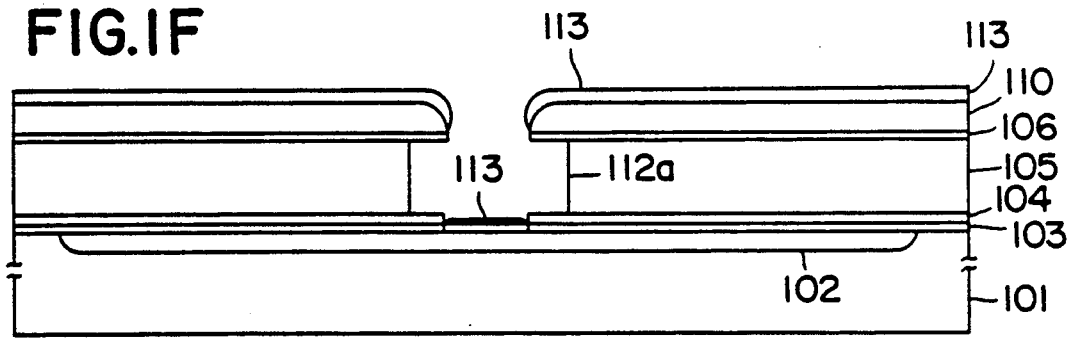
Figure 2:
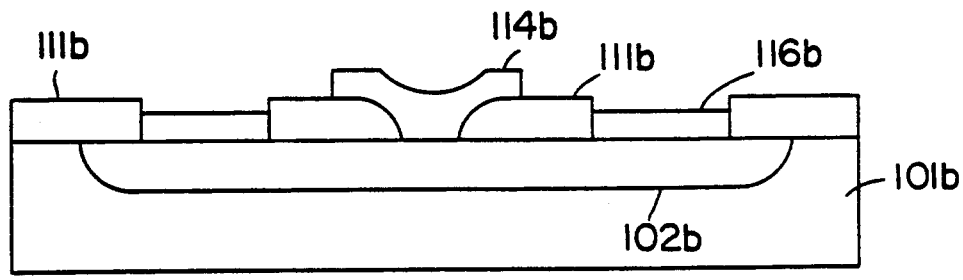
FIGS. 2-5 are cross-sectional views of other attempts to form reduced gate length GaAs MESFET devices.
Figure 3:
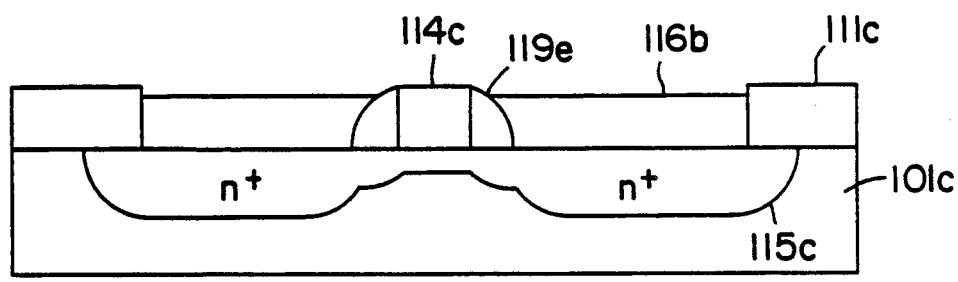
Figure 4:
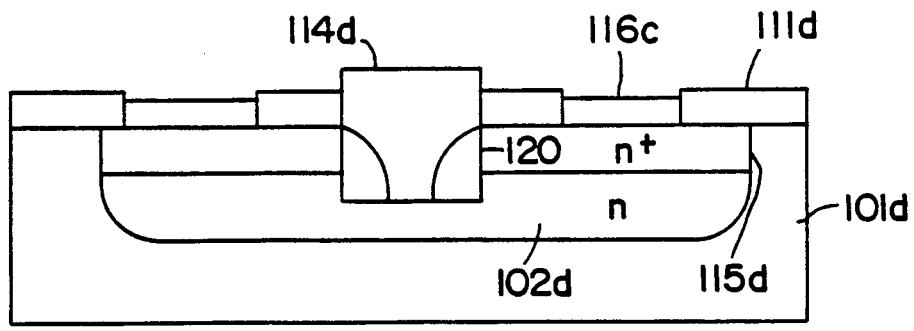
Figure 5:
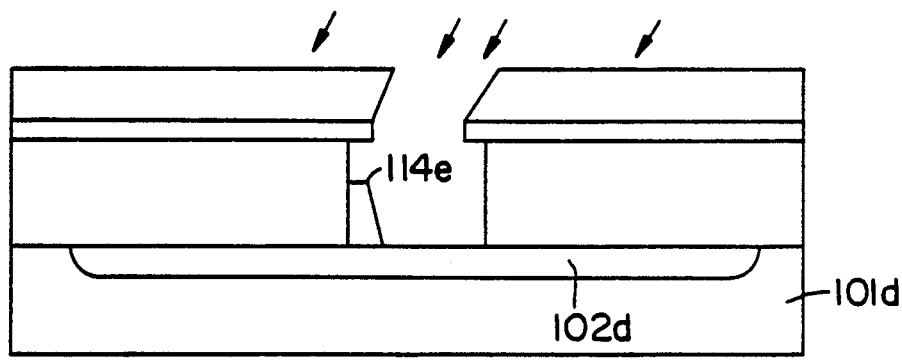

As shown in FIG. 1E, a conductive material such as tungsten silicide having good thermal resistance is deposited to a thickness of about 1,000 Å by, e.g., sputtering. The tungsten silicide layer 113 protects the surface of the gallium arsenide substrate during subsequent side wall etching of the photoresist layer 105 and during high temperature processing such as activation of ion implanted impurities. The side walls of the lower photoresist layer 105 are then etched under the same conditions as etching of the second or intermediate layer photoresist 107. This etching controls the shape of the opening 112a in the lower photoresist layer 105 and, thus, the shape of the T-shaped gate 114. Thus, the process time is controlled to form the desired shape; for example, etching can be performed for about twenty minutes FIG. 1F shows the stage of the method after such etching.

If desired, titanium may be deposited on the tungsten silicide by, e.g., vapor deposition. The deposited titanium, along with the exposed portion 104a of the titanium layer 104 can be used as an electrode for gold plating under a temperature of 50° C. and a growing rate of 0.1 μm/minute. The T-shaped gate 114 is then formed, as shown in FIG. 1G. Lift-off of the lower photoresist layer 105 can be accomplished using acetone and oxygen plasma, and removal of the photoresist using oxygen plasma etching at a power of 100 to 200 W under a pressure of 2 Torr for ten to twenty minutes flowing oxygen at 10 sccm. After removing the titanium layer 104 by dry etching, source and drain regions 115 can be formed using the T-shaped gate 114 and photolithographically patterned resist layer 105b as a mask. For example, silicon can be ion implanted using the T-shaped gate as a mask at an energy of 100 to 200 Kev and a dose of 1 to $5 \times 10^{13}/cm^2$. After activation of the implanted ions at, e.g. a temperature of 800 to 900° C. for three to thirty seconds in a hydrogen atmosphere, an N+ layer forming the ohmic contact region of the source and drain 115 are formed as shown in FIG. 1H.

FIG. 1I shows a completed device. Contact holes are then formed in nitride layer 103 and ohmic contact metal 116a, 116b deposited and patterned to form source and drain ohmic contacts. The ohmic contact metal 116a, 116b may be AuGe/Ni having a thickness of 1,500 Å/400 Å. The device may be heat-treated at a temperature of about 450° C. for twenty minutes to form good ohmic contact. An insulating layer 117 such as polyimide may be deposited and metal connect lines 118 deposited and patterned.

While we have shown and described various embodiments in accordance with the present invention, it is understood that the same is not limited thereto, but is susceptible of numerous changes and modifications as known to one having ordinary skill in the art. For example, it is possible to use materials other than those mentioned in connection with the specific embodiment described above for the various layers. We therefor do not wish to be limited to the details shown and described herein, but intend to cover all such modifications as are encompassed by the scope of the appended claims.

We claim:

1. A method for producing a self-aligned field effect transistor having an active layer in a substrate, a T-shaped gate electrode having a predetermined gate length over a portion of said active layer, a source contact region and a drain contact region in said substrate on either side of said T-shaped gate, said method comprising:

providing a substrate having an active layer therein;

depositing in turn an insulating layer and a metal layer;

forming a first resist layer over said substrate:

depositing an insulating layer for masking on the first resist layer;

forming a second resist layer over said insulating layer;

depositing a doped oxide layer on the second resist layer;

forming a third resist layer over the doped oxide layer;

forming a patterned first masking layer over said third resist layer;

etching said second layer using said patterned masking layer as a mask to leave a portion of said second resist layer in the form of a dummy gate having said predetermined gate length over said active layer;

depositing a second masking layer over portions of said first resist layer not covered by said second resist layer and over said second resist layer;

etching said second resist layer to remove said dummy gate and said second masking layer overlying said dummy gate;

etching said first resist layer using said second masking layer as a mask and exposing a portion of said active layer corresponding to said predetermined gate length;

depositing conductive material over said portion of said active layer corresponding to said predetermined gate length;

etching side portions of said first resist layer using said second masking layer as a mask to leave portions of said second masking layer overhanging an opening in said first resist layer;

forming a T-shaped gate by gold-plating conductive material with an electrode;

etching away said first resist layer;

doping said substrate using said T-shaped gate as a mask to form said source contact region and said drain contact region;

depositing and treating by heat AuGe/Ni to make source and drain ohmic contact and depositing a doped oxide insulating layer to cover over the substrate; and opening a contact window and, after depositing the metal layer, producing an interconnection metal line by etching.

2. A method according to claim 1, wherein said dummy gate has a gate length of 0.3 to 0.5 microns.

3. A method according to claim 1, wherein an insulating layer is provided between said first and second resist layers and an exposed portion of said insulating layer is etched after removing said dummy gate and before etching said first resist layer.

4. A method according to claim 3, further comprising depositing a metal layer that acts as a mask to protect the substrate before the side-etching of the first resist layer.

5. A method according to claim 1, wherein the second resist layer is side-etched using a mixed gas of $SF_6$ and oxygen to transfer the gate in the form of submicron.

6. A method according to claim 1, wherein a doped oxide layer is SOG and is between the second resist layer and third resist layer, the third resist layer forming an upper pattern.

7. A method according to claim 1, wherein the first resist layer is etched with a mixed gas of oxygen and $C_2ClF_5$.

8. A method according to claim 1, wherein the first resist layer is side etched to limit the form of the T-shaped gate.

* * * * *